(12) United States Patent
Zhang et al.

(10) Patent No.: US 6,853,578 B1
(45) Date of Patent: Feb. 8, 2005

(54) PULSE DRIVEN SINGLE BIT LINE SRAM CELL

(75) Inventors: Wei Zhang, Sunnyvale, CA (US); Feng Chen, Fremont, CA (US); Jianbin Wu, Fremont, CA (US)

(73) Assignee: Piconetics, Inc., Fremont, CA (US)

( * ) Notice: Subject to any disclaimer, the term of this patent is extended or adjusted under 35 U.S.C. 154(b) by 23 days.

(21) Appl. No.: 10/101,075

(22) Filed: Mar. 18, 2002

(51) Int. Cl.[7] .............................................. G11C 7/00
(52) U.S. Cl. ..................... 365/154; 365/188; 365/174; 365/189.01; 365/189.03
(58) Field of Search ............................... 365/154, 188, 365/174, 189.01, 189

(56) References Cited

U.S. PATENT DOCUMENTS

| | | | | |
|---|---|---|---|---|
| 5,923,593 A | * | 7/1999 | Hsu et al. .............. | 365/189.04 |
| 6,006,339 A | * | 12/1999 | McClure .................... | 713/500 |
| 6,067,253 A | * | 5/2000 | Gotou .................. | 365/185.25 |
| 6,108,233 A | * | 8/2000 | Lee et al. .................... | 365/154 |
| 6,246,386 B1 | * | 6/2001 | Perner .......................... | 345/90 |
| 6,473,334 B1 | * | 10/2002 | Bailey et al. ............... | 365/154 |
| 6,590,812 B2 | * | 7/2003 | Frey ...................... | 365/189.05 |

\* cited by examiner

Primary Examiner—Viet Q. Nguyen
(74) Attorney, Agent, or Firm—Anthony Diepenbrock III; Dechert LLP

(57) ABSTRACT

A single bit line, pulse-operated memory cell. The memory cell includes a first and second inverter, write access and feedback-control transistors, and read access transistor and read buffer transistors. The output of the first inverter is connected to the input of the second inverter and the output of the second inverter is connected to the input of the first inverter through the channel of the feedback-control transistor. The write access and feedback-control transistors are opposite types, and their gates are connected together so that when the feedback control transistor is on the write-access transistor is off and visa versa. Writing the cell thus avoids contending the with the on-transistor of the second inverter. The output of the cell is sensed by the gate of the buffer transistor and coupling the output of the buffer transistor through the read access transistor to the read output line.

6 Claims, 5 Drawing Sheets

PULSE DRIVEN SINGLE BIT LINE SRAM CELL

CROSS-REFERENCE TO RELATED APPLICATIONS

This application is related to U.S. patent application Ser. No. 09/967,189, entitled, RESONANT LOGIC AND THE IMPLEMENTATION OF LOW POWER DIGITAL INTEGRATED CIRCUITS, filed Sep. 27, 2001, incorporated by reference, and U.S. patent application Ser. No. 09/614,494, entitled, RESONANT LOGIC AND THE IMPLEMENTATION OF LOW POWER DIGITAL INTEGRATED CIRCUITS, filed Jul. 11, 2000.

FIELD OF THE INVENTION

This invention relates generally to a SRAM cell having a single bit line and more particularly to an SRAM cell configured to operate in response to a pulse-driven word line.

DESCRIPTION OF THE RELATED ART

FIG. 1 show a prior art six-transistor static memory (SRAM) cell 10. The SRAM cell 10 includes two CMOS inverters 12, 14 that are cross-coupled (the output of each inverter is connected to the input of the other) to create a latch, and two access transistors 16, 18 by which the latch is read or altered (written). The first inverter 12 includes PMOS transistor 20 and NMOS transistor 22. The second inverter 14 includes PMOS transistor 24 and NMOS transistor 26. The first access transistor 16 provides a channel between the output of the first inverter 12 and a first bit line 28, BL. The second access transistor 18 provides a channel between the output of the second inverter 14 and a second bit line 30, BLbar, which is the complement to the first bit line 28. The gates of the access transistors are connected to a word line 32 WL that, when high, causes the channels of the access transistors 16, 18 to become conductive.

Altering the state of the device of FIG. 1 involves bringing the word line 32 high, and presenting a data bit and its complement on the BL 28 and BLbar 30 lines, respectively. The data bits presented on the bit lines are opposite in state to the state of the inverter outputs to which the bit lines are coupled by the access transistors. The resulting voltage at the inverter inputs then flips the cell to the opposite state.

Sensing the state of the device of FIG. 1 involves bringing the word line 32 high, and detecting the difference between the voltages which the cell provides via the access transistors to the bit lines, BL 28 and BLbar 30, typically by means of a differential amplifier. Care must be taken during the sensing operation not to change the state of the cell.

This six-transistor cell has a relatively large layout area because of the complementary bit lines, but results in a relatively stable device.

FIG. 2 shows a prior art, five-transistor, static memory cell 40 that eliminates the complementary bit line in an attempt to reduce the layout area of the cell. Though the cell 40 uses less area than the six transistor cell 10, it has less than adequate margins for the read voltage. Again, two inverters 42, 44 are cross-coupled to form the basic cell. A single access transistor 46 is connected between a single bit line 48 and an output of one of the inverters 42. The gate of the access transistor 46 is connected to the word line 62.

Altering the state of the cell shown in FIG. 2 requires bringing the word line high 62, and presenting the data to be written on the bit line 48. If the data bit is a logical one and node A is a logic low, then the voltage provided by the access transistor 46 to node A of the cell is f1×Vdd, where Vdd is the voltage on the bit line and f is the voltage divider ratio (about 0.6) derived from the on-resistance of the access transistor 46 and the on-resistance of the conductive (NMOS) transistor 52 of the inverter driving node A. The access transistor 46 and conductive transistor 52 of the inverter driving node A are considered as a voltage divider because they contend with each other, i.e., they are both on at the same time. This voltage f1×Vdd must be higher than the trigger threshold $V_{TRIG}$ of the inverter input connected to node A to flip the cell to the opposite state. If the data on the bit line 48 is a logical zero and node A is a logic high, then the voltage provided by the access transistor 46 to node A of the cell is f2×Vdd, where f2 is the voltage divider ratio (about 0.1) derived from the on-resistance of the access transistor 46 and the on-resistance of the conductive (PMOS) transistor 50 of the inverter driving node A. This voltage f2×Vdd must lower than the trigger threshold $V_{TRIG}$ of the inverter input connected to node A to flip the cell to the opposite state. Divider ratios f1 and f2 are adjusted by altering the L/W ratios of the access transistor 46 and the transistors 50, 52 in the inverter 42 that drives node A.

One technique of reading the five-transistor cell 40 of FIG. 2 involves precharging the bit line 48 to the positive supply voltage and applying a voltage equal to the trigger threshold $V_{TRIG}$ of the inverter 44 to the gate of the access transistor 46. If node A is a logical high, the access transistor 46 is off and the bit line stays charged. If node A is a logical low, the access transistor turns on, applying a voltage no greater than $V1_{TRIG}$-Vtp to node A, which is insufficient to affect the state of the cell, because it is less than $V_{TRIG}$ of inverter 44. After a short time, the bit line connected to the access transistor falls to a voltage much less than the voltage to which it was precharged, thus allowing detection of a logical low at node A.

FIG. 3 shows a prior art five-transistor static memory cell 70 designed to overcome the shortcomings of the cell of FIG. 2. The cell 70 includes two cross-coupled inverters 72, 74, an access transistor 76 having its channel connected between the bit line 78 and the cell input, the input to inverter 74, and its gate connected to the word line 92. The cell 70 is configured to operate with a variable cell control voltage 88. During a read operation, the cell 70 is powered with the standard supply voltage, Vdd supplied by cell control voltage 88, but during a write operation the cell is powered with a voltage that is less than Vdd to weaken the strength, by lowering the gate-to-source voltage, of the pull-down transistor when changing the state of node A from a zero to a one. One drawback of the circuit of FIG. 3 is that the cell control voltage must power an array of cells, but still be controllable. Another drawback is that the timing constraints on the word line and bit line are difficult to meet for large arrays.

Thus, there is a need for an improved SRAM cell having a reduced layout area, a single bit line, a non-variable positive supply voltage powering the cell, good noise margin reading the cell, and a reliable write operation.

BRIEF SUMMARY OF THE INVENTION

The present invention is directed towards the above need. A memory cell, in accordance with one embodiment of the present invention, includes first and second inverters, a feedback control transistor, a write-access transistor, a read buffer transistor and a read access transistor. The first and second inverters are configured to operate between from a voltage applied between a supply line and a return line. The output of the first inverter is connected to the input of the second inverter. The feedback-control transistor's channel is connected between the output of the second inverter and the input of the first inverter. The write-access transistor, opposite in type to the feedback-control transistor, has its channel connected between the input of the first inverter and the bit line on which write data is received. The gate of the write access transistor is connected to the gate of the feedback-control transistor. The read buffer transistor has its gate connected to the output of the first inverter. The channel of the read access transistor and the channel of the read buffer transistor are connected in series, and the series-connected channels are connected between the return line of the first inverter and the read data output line. The gate of the read access transistor is connected to a read enable line.

A method in accordance with the present invention includes (i) applying, to the gates of the write access and feedback-control transistors, a first voltage that causes the write access transistor channel to become conductive and the feedback-control transistor channel to become non-conductive, (ii) while the first voltage is applied, applying a voltage representing write data to the bit line, the write data voltage being sufficient to change the inputs and outputs of the first and second inverters, (iii) applying, to the gates of the write access and feedback-control transistors, a second voltage that causes the write access transistor channel to become non-conductive and the feedback-control transistor to become conductive, so as to stably hold the write data in the memory cell.

Another method in accordance with the present invention includes (i) precharging the read output data line to a logic one, and (ii) applying an active read enable signal to the gate of the read access transistor to cause the read access transistor channel to become conductive. The channel of the read access transistor and the read buffer transistor are connected in series and the series-connected channels are connected between the read output data line and a reference voltage. When the read enable signal is active, the read output data line is pulled to the reference voltage if the output of the first inverter, which is connected to the gate of the read buffer transistor is a logic one.

One advantage of the present invention is that the write access transistor does not contend with the on-transistor of the second inverter during a write operation. This reduces supply current and circuit noise during a write operation.

Another advantage of the present invention is that the read access does not disturb the contents of the memory cell, because the output of the cell is buffered by a high-impedance gate input.

Yet another advantage of the present invention is that only a single bit line for a read or a write operation is needed, thereby reducing the physical space occupied by the memory cell.

Yet another advantage is that the memory cell does not require a variable positive supply voltage to power the cell, with one voltage for reading the cell and another voltage for writing the cell.

Yet another advantage is that the memory cell can be configured to accept either an active high or active low pulse as the write enable signal.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
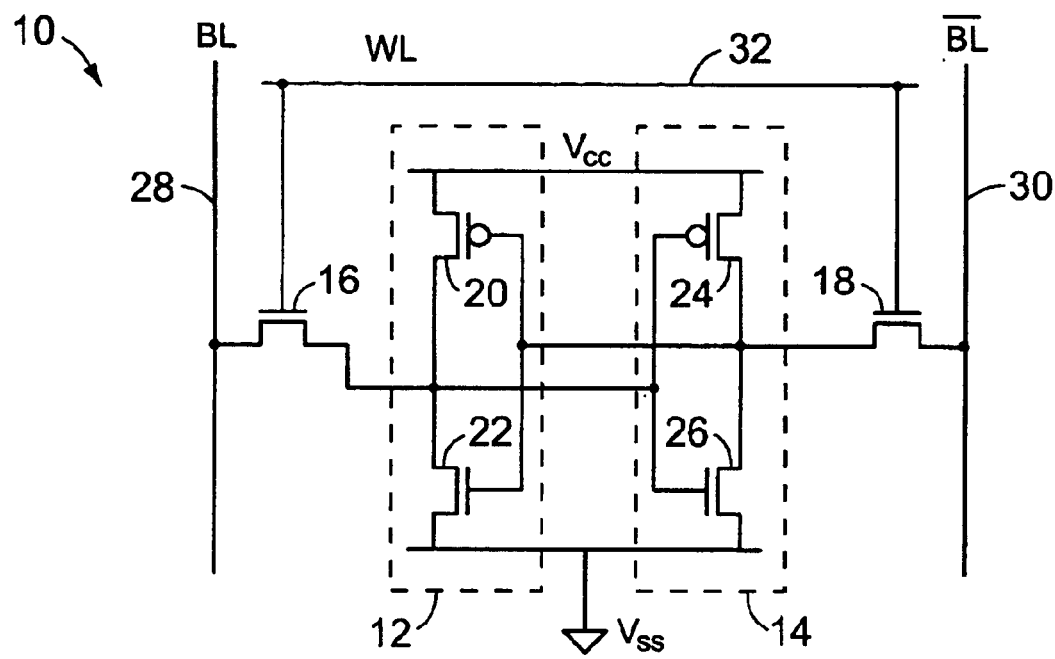
FIG. 1 shows a prior art six-transistor static memory cell.
Figure 2:
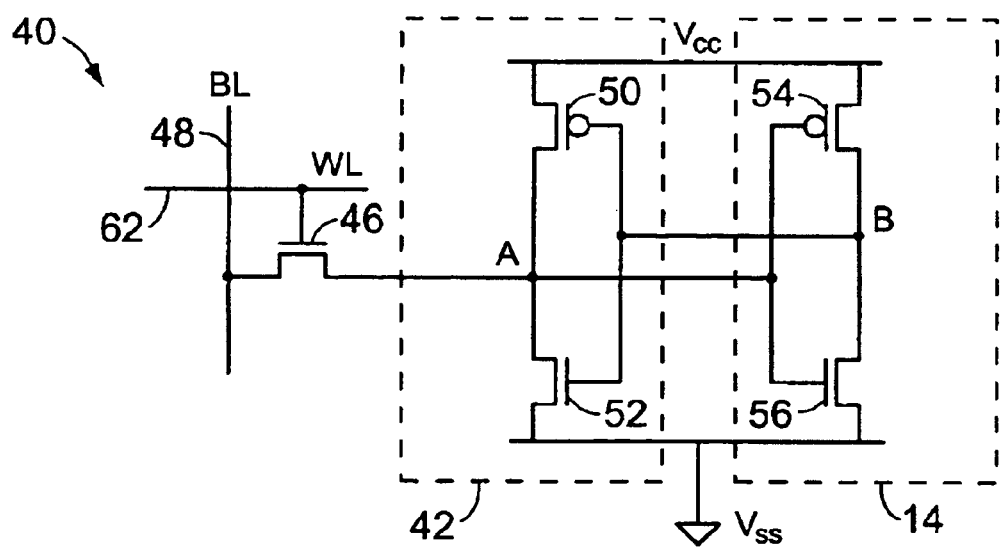
FIG. 2 shows a prior art five-transistor static memory cell.
Figure 3:
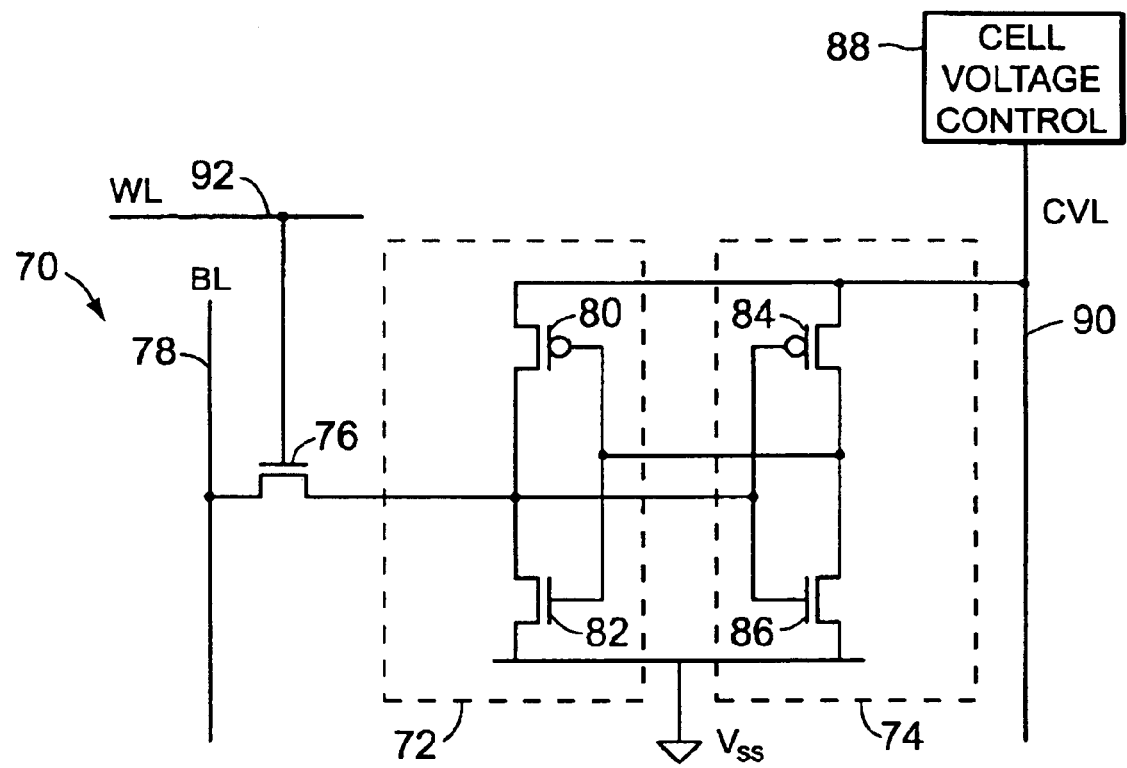
FIG. 3 shows a prior art five-transistor static memory cell configured to operated with a variable cell control voltage.
Figure 4:
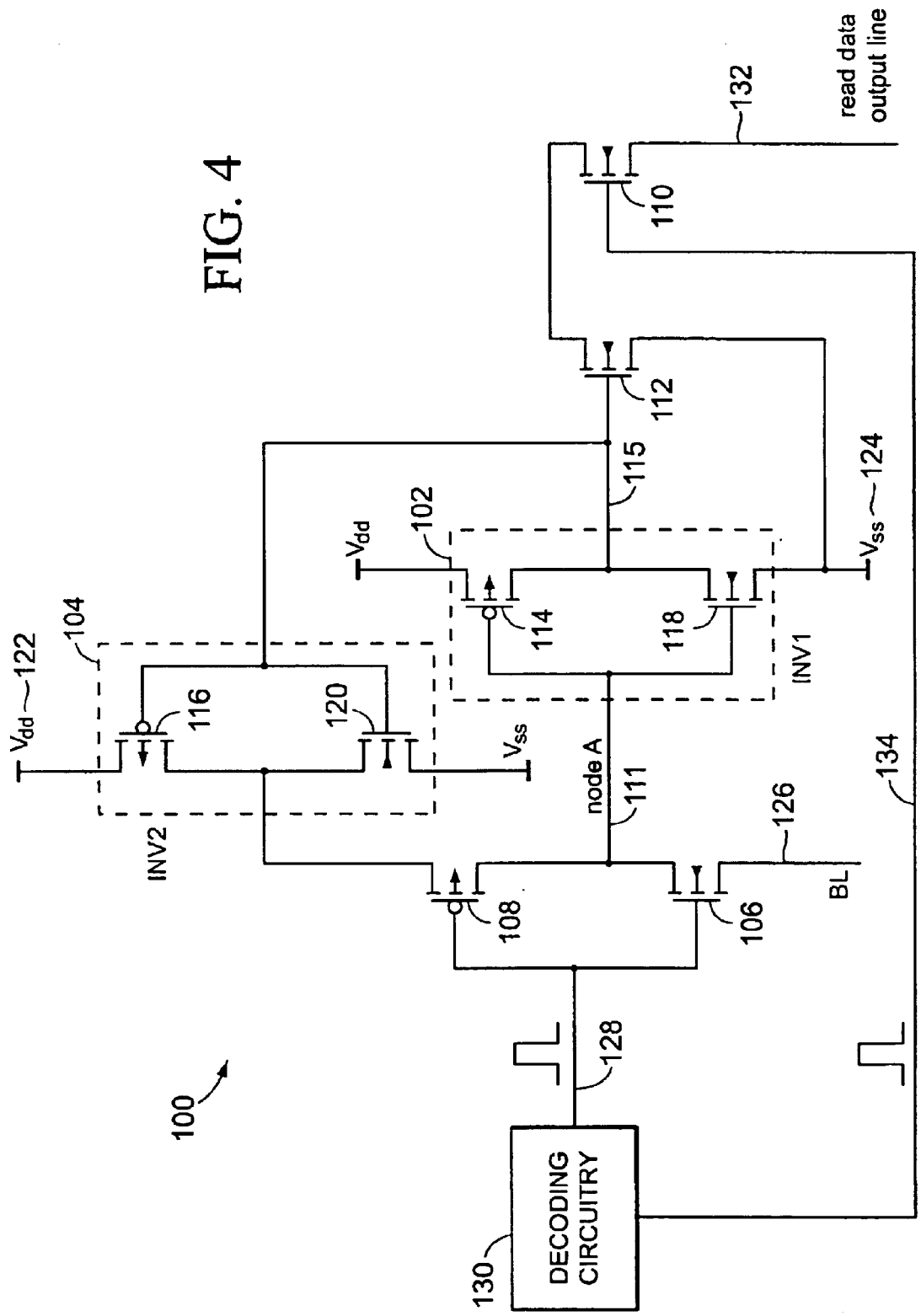
FIG. 4 shows a single bit line, pulse-driven, static memory cell in accordance with one embodiment of the present invention.

FIG. 4 shows a single bit line, pulse driven, static memory cell 100, in accordance with one embodiment of the present invention. The memory cell includes two inverters 102, 104, a write access transistor 106, a feedback-control transistor 108, a read-access transistor 110 and a read buffer transistor 112.

The two inverters 102, 104 each include a p-channel pull-up transistor 114, 116 and an n-channel pull-down transistor 118, 120 (with the respective gates and drains of the pull-up and pull-down transistors each tied together). The inverters 102, 104 operate between the positive voltage supply Vdd 122 and a return potential Vss 124. The first inverter 102 has an output 115 connected to the input of the second inverter 104 and the second inverter 104 has an output connected to the input of the first inverter 102 through the channel of the feedback-control transistor 108. Thus, the inverters 102, 104 are only cross-coupled when the feedback-control transistor 108 has a conductive channel. The channel of the write access transistor 106 is connected between the bit line 126 and the input of the first inverter 102, node A. The gates of the write access transistor 106 and the feedback-control transistor 108 are tied together and to a write word line 128, which is derived from the decoding circuitry 130, not part of the cell 100. The pull-up transistors 114, 116 are sized relative to the pull-down transistors 118, 120 so that the pull-down transistors 118, 120 are relatively stronger than the pull-up transistors 114, 116. In one embodiment, the n-channel transistor 118, 120 in each inverter is three times stronger than the p-channel transistor 114, 116 in each inverter.

The channels of the read buffer transistor 112 and the read-access transistor 110 are connected in series and the series-connected channels are connected between Vss 124 and a data out bit line 132, on which the cell's data is captured. The gate of the read buffer transistor 112 is connected to the output of the first inverter 102. The gate of the read-access transistor 110 is connected to a read word line 134 from the decoding circuitry 130, which provides a read pulse at the appropriate time to read the cell 100.

Writing the cell operates as follows, assuming that the feedback-control transistor 108 is a p-channel device, the write access transistor 106 is an n-channel device and the decoding circuitry 130 provides a positive pulse on the write word line 128. The write word line 128 is brought high, thereby turning off the feedback-control transistor 108 and making the write access transistor 106 channel conductive. If the bit line 126 is a logic high and node A is a logic low, node A is pulled up to the voltage level of the bit line (Vdd) less Vtn, the threshold voltage of the write access transistor 106. This causes node A to rise to approximately Vdd-Vtn, which turns off the pull-up transistor 114 and turns on the pull-down transistor 118 of the first inverter 102, causing the output of the first inverter 102 to drive a logic zero to the input of the second inverter 104. The second inverter 104 receives the logic zero and drives a logic one at its output.

However, because the feedback-control transistor 108 is not conductive, the output of the second inverter 104 has no effect on node A. When the voltage on the write word line 128 is brought low, ending the pulse on the write word line, the access transistor turns 106 off and the feedback-control transistor 108 turns on, closing the feedback loop and latching the logic high into the cell 100.

If the bit line 126 is a logic low and node A is a logic high, then node A is pulled towards Vss by the access transistor 106, causing the pullup transistor 114 of the first inverter 102 to turn on and the pull-down transistor 118 of the first inverter 102 to turn off. The first inverter 102 now drives a high voltage to the input of the second inverter 104, which inverts the level to become a logic zero at its output. When the word line 128 pulse ends, the feedback loop is closed and a logic zero at node A is now latched into the cell 100. In the writing of a logic one or a logic zero to the cell, the access transistor 106 does not contend with the on-transistor (either 116, 120) of the second inverter 104, because the second inverter's output is isolated from node A by the non-conductive channel of the feedback-control transistor 108.

Figure 5:
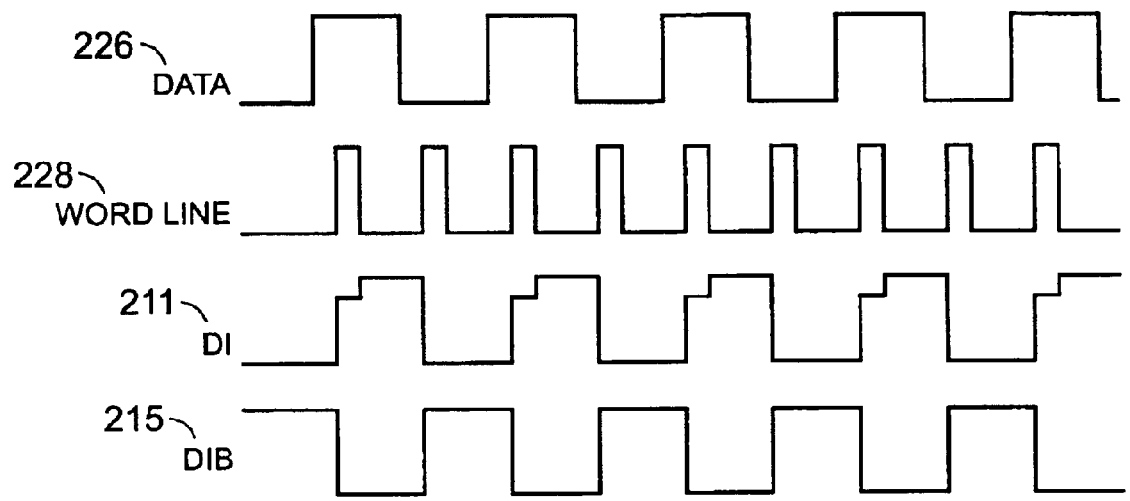
FIG. 5 shows a set of waveforms that pertain to the various nodes of the static memory cell of the present invention during a write operation.

FIG. 5 shows a set of waveforms that pertain to the various nodes of the static memory cell of the present invention during a write operation. The DATA waveform 226 shows the state of the write bit line 126, i.e., data that is to be stored into the cell. The WORDLINE waveform 228 shows the word line pulses provided by the decoding circuitry 130 and DIB 215 and DI 211 are the outputs of the first inverter 102 and second inverter 104, respectively. The WORDLINE 228 is pulsed after the DATA waveform 226 has reached a logic high or a logic low. The DIB waveform 215 of the first inverter 102 snaps to a logic low in response to the pulse on the word line 128 when the DATA 226 input is high and to a logic high in response to the pulse on the WORDLINE 228 when the DATA 226 input is low. The DI waveform 211 is the complement of the DIB waveform 215, but has tiny step after the rising edge. The step is caused by the Vtn threshold drop of the n-channel write access transistor 106. The normal logic high level is established when the feedback loop is closed, after the word line pulse is completed.

Figure 6:
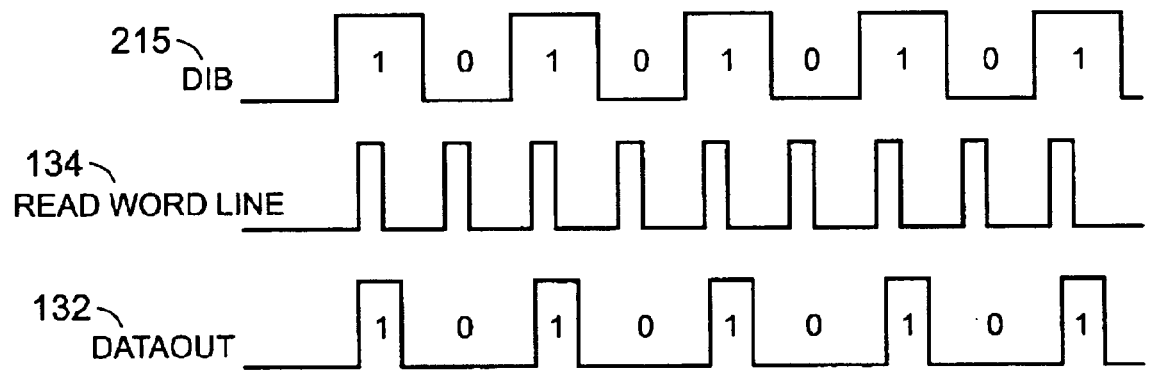
FIG. 6 shows a set of waveforms that pertain to the various nodes of the static memory cell of the present invention during a read operation.

FIG. 6 shows waveforms relating to a read operation. To read the cell, the read output data line is precharged to a logic high (by circuitry not shown) and the decoding circuitry provides a positive pulse on the read word line 134. The positive pulse on the read word line causes the read-access transistor 110 channel to become conductive, allowing the read buffer transistor 112 to pull the read data output line low, if the output 115 of the first inverter 102 is a logic high. Otherwise, the read data output line stays high, reflecting the logic low of the first inverter output 115. An inverter connected to the read output line inverts the read output line to provide a logic true at the output of the inverter. This method of reading the cell prevents disturbance to the contents of the cell because the output of the first inverter drives the high-impedance gate of the read buffer transistor 112, thereby isolating the cell from the capacitance of the data output line.

Figure 7:
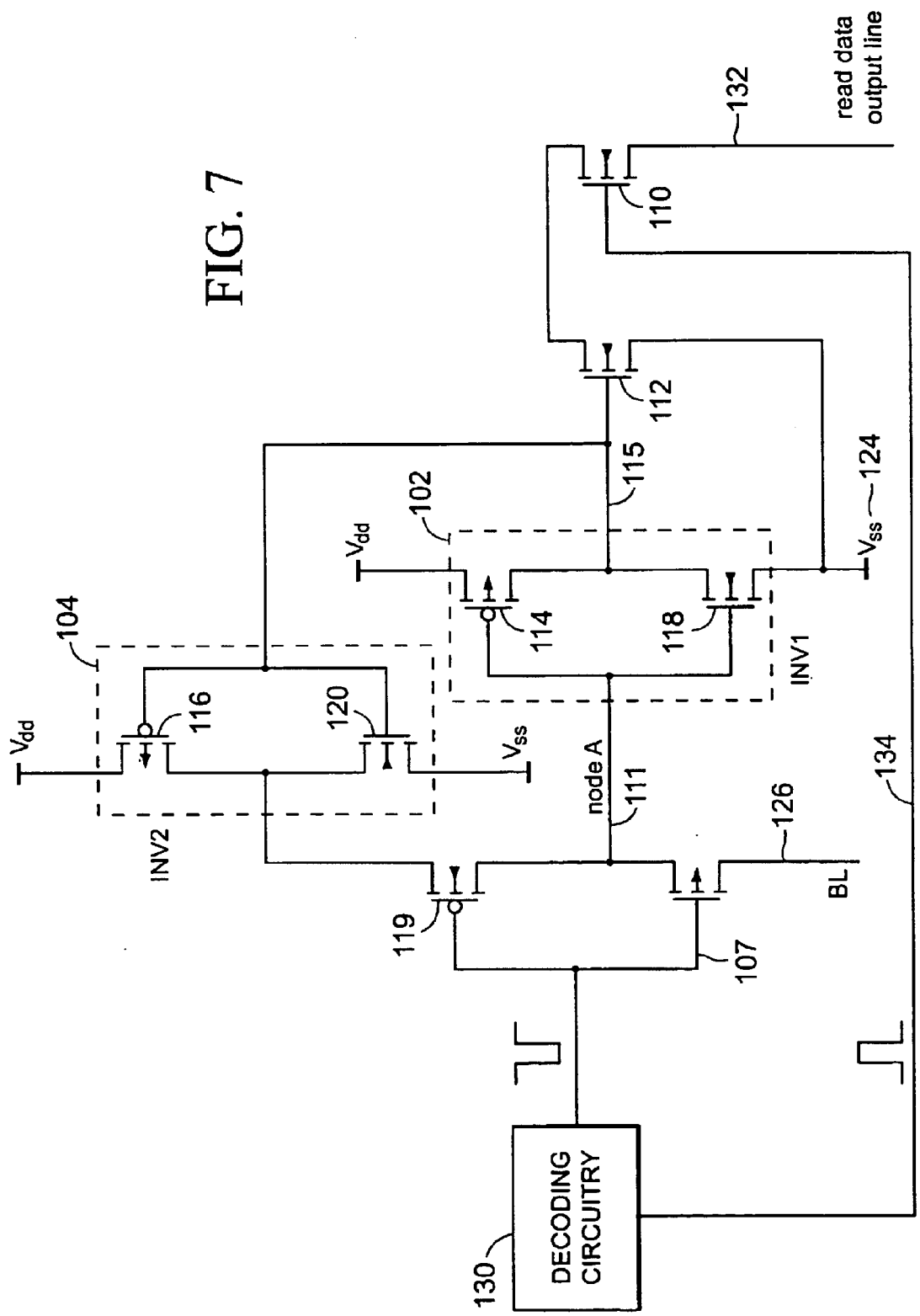
FIG. 7 shows the single bit line, pulse-driven, static memory cell in accordance with another embodiment of the present invention.

Although the present invention has been described in considerable detail with reference to certain preferred versions thereof, other versions are possible. In one alternative version shown in FIG. 7, the write access transistor 107 is a p-channel device and the feedback-control transistor 119 is an n-channel device. This requires that the write word line 128 use a negative-going pulse to write the cell 100. The feedback-control transistor 119 is turned off and the write access transistor 107 is turned on by pulsing the write word line from a high-to-low. The feedback-control transistor 119 is then turned back on and the write access transistor 107 turned off when the write word line returns to a high voltage. Therefore, the spirit and scope of the appended claims should not be limited to the description of the preferred versions contained herein.

What is claimed is:

1. A memory cell comprising:
   a first inverter for generating, at an output of the first inverter, a logical inversion of a signal at an input of the first inverter;
   a second inverter for generating, at an output of the second inverter, a logical inversion of a signal at an input of the second inverter, the input of the second inverter being connected to the output of the first inverter;
   wherein the first and second inverters are configured to operate from a voltage applied between a supply line and a return line;
   a feedback-control transistor having a gate and a channel between a source region and a drain region of the transistor, the channel of the feedback-control transistor being connected between the output of the second inverter and the input of the first inverter;
   a write-access transistor being opposite in type to the feedback-control transistor, and having a gate and a channel between a source region and a drain region of the transistor, the channel of the write-access transistor being connected between the input of the first inverter and the bit line, and the gate of the write access transistor being connected to the gate of the feedback-control transistor;
   a read buffer transistor having a gate and a channel between a source region and a drain region of the transistor, the gate of the read buffer transistor being connected to the output of the first inverter; and
   a read access transistor having a gate and a channel between a source region and a drain region of the transistor, the channel of the read buffer transistor and the read access transistor being connected in series, the series-connected channels being connected between the return line of the first inverter and the read data output line, the gate of the read access transistor being connected to a read enable line.

2. A memory cell as recited in claim 1,
   wherein the channel of the write-access transistor becomes conductive and the channel of the feedback-control transistor becomes non-conductive, when a write-enable signal having a first voltage is applied to the gate of the feedback-control transistor; and
   wherein the channel of the write-access transistor becomes non-conductive and the channel of the feedback-control transistor becomes conductive, when a write-enable signal having a second voltage is applied to the gate of the feedback-control transistor.

3. A memory cell as recited in claim 1, wherein the feedback control transistor is a p-channel device and the write-access transistor is a n-channel device; and wherein the write-enable signal is applied when a voltage at the gate of the feedback control transistor is more positive than the voltage on the return line.

4. A memory cell as recited in claim 1, wherein the feedback control transistor is a n-channel device and the write-access transistor is a p-channel device; and wherein the write-enable signal is applied when a voltage at the gate of the feedback control transistor is approximately equal to the voltage of the return line.

5. A memory cell as recited in claim 1, wherein the read buffer transistor and the read access transistor are n-channel devices; and wherein when the read enable signal is applied with a first inverter having a logic high the read data output line is pulled to the voltage of the return line.

6. A memory cell as recited in claim 1, wherein the first and second inverters each include a p-channel pullup transistor and a n-channel pull down transistor; and wherein the n-channel transistors of each inverter having a channel length-to-width ratio that is at least three limes a channel length-to-width ratio of the p-channel transistors of each inverter.

* * * * *